(12) United States Patent
Choi

(10) Patent No.: US 7,226,725 B2
(45) Date of Patent: Jun. 5, 2007

(54) NEGATIVE RESIST COMPOSITION COMPRISING BASE POLYMER HAVING EPOXY RING AND SI-CONTAINING CROSSLINKER AND PATTERNING METHOD FOR SEMICONDUCTOR DEVICE USING THE SAME

(75) Inventor: Sang-Jun Choi, Seoul (KR)

(73) Assignee: Samsung Electronics Co., Ltd., Suwonsi, Gyeonggi-do (KR), .

( * ) Notice: Subject to any disclaimer, the term of this patent is extended or adjusted under 35 U.S.C. 154(b) by 0 days.

(21) Appl. No.: 11/434,536

(22) Filed: May 15, 2006

(65) Prior Publication Data

US 2006/0204897 A1 Sep. 14, 2006

Related U.S. Application Data

(62) Division of application No. 10/395,914, filed on Mar. 24, 2003, now Pat. No. 7,078,156.

(30) Foreign Application Priority Data

Jun. 14, 2002 (KR) ............................... 2002-33351

(51) Int. Cl.
*G03F 7/40* (2006.01)

(52) U.S. Cl. ...................................................... 430/316
(58) Field of Classification Search ................. 430/316
See application file for complete search history.

(56) References Cited

U.S. PATENT DOCUMENTS

| 5,457,005 A | 10/1995 | Babich et al. |
| 5,886,102 A | 3/1999 | Sinta et al. .................. 525/154 |
| 2002/0031718 A1* | 3/2002 | Hashimoto et al. ....... 430/270.1 |

FOREIGN PATENT DOCUMENTS

| EP | 0 466 025 A2 | 1/1992 |
| EP | 0 506 432 A1 | 3/1992 |

* cited by examiner

*Primary Examiner*—Cynthia Hamilton
(74) *Attorney, Agent, or Firm*—F. Chau & Associates, LLC

(57) ABSTRACT

A negative resist composition and a patterning method for semiconductor devices using the composition are provided. In one aspect, a negative resist composition comprises an alkali-soluble base polymer having an epoxy ring substituent, a silicon-containing crosslinker having multiple hydroxy groups, and a photoacid generator. In another aspect, a patterning method includes using the negative resist composition in a bi-layer resist process to form fine patterns.

15 Claims, 2 Drawing Sheets

NEGATIVE RESIST COMPOSITION COMPRISING BASE POLYMER HAVING EPOXY RING AND SI-CONTAINING CROSSLINKER AND PATTERNING METHOD FOR SEMICONDUCTOR DEVICE USING THE SAME

CROSS-REFERENCE TO RELATED APPLICATION

This application is a Divisional of U.S. application Ser. No. 10/395,914, filed Mar. 24, 2003 now U.S. Pat. No. 7,078,156, the disclosure of which is hereby incorporated by reference herein in its entirety.

FIELD OF THE INVENTION

The present invention relates to a silicon-containing photoresist composition and a patterning method for a semiconductor device, and more particularly, to a silicon (Si)-containing negative resist composition suitable for use in a bi-layer resist process, and a patterning method for a semiconductor device using the same.

BACKGROUND

As the manufacture of semiconductor devices becomes more complicated and the integration density of semiconductor devices highly increases, there is a need to form fine patterns. Furthermore, with regard to 1-Gigabit or more semiconductor memory devices, a pattern size having a design rule of 0.1 µm or less is needed. Therefore, the use of conventional photoresist materials for a KrF eximer laser (248 nm) is limited. For this reason, lithography techniques using an ArF eximer laser (193 nm) or an $F_2$ eximer laser (157 nm), which are shorter-wavelength energy sources than a KrF eximer laser, have emerged. Lithography processes using an $F_2$ eximer laser (157 nm) need resist materials having a new structure.

However, ArF and $F_2$ resist materials have many problems due to their structural limitations as compared with i-line or KrF resist materials, which include pattern collapse due to the fine pattern size and poor resistance to dry etching. Therefore, there is a need to develop new resist materials and processes therefor.

In a photolithography process for manufacturing highly integrated semiconductor devices, the application of a bi-layer resist (BLR) process ensuring dry-etching resistance and formation of high aspect ratio patterns, which eliminates drawbacks of a single layer resist process, is advantageous.

In the BLR process, binary chemically amplified resists have been widely used, which are composed of a silicon-containing polymer having in its backbone silicon atom substituents and a photoacid generator (i.e., positive chemically amplified resists). Also, the development of highly sensitive resist materials for BLR processes using a short-wavelength light source has been focused on positive chemically amplified resists. However, silicon-containing resist compositions developed to date for BLR processes have strong hydrophobicity and exhibit poor adhesion to an underlying layer. Also, it is difficult to control the amount of silicon to an appropriate level for resist materials.

The use of positive resists is limited in forming isolated patterns for high-speed, high-performance DRAMs. A lithography process for manufacturing 1-Gigabit or more DRAMs requires the use of a phase shift mask. In designing phase shift masks, it is more advantageous to use negative resists than positive resists. Therefore, there is an urgent need for the development of negative resists that are highly transparent for an exposure light source having a short wavelength and exhibit high resolution and high dry-etching resistance characteristics.

SUMMARY OF THE INVENTION

The present invention is directed to a negative resist composition having high transmittance in a short-wavelength region and high dry-etching resistance as it contains silicon, and to a method for forming fine patterns having a high aspect ratio, as is required for highly integrated semiconductor devices. Preferably, a negative resist composition according to the invention can be effectively used in bi-layer resist (BLR) processes to secure high resolution and high aspect ratio.

According to an embodiment of the present invention, a negative resist composition comprises an alkali-soluble base polymer having an epoxy ring substituent, a silicon-containing crosslinker having multiple hydroxy functional groups, and a photoacid generator (PAG).

Preferably, the alkali-soluble base polymer is an epoxy phenol-novolac resin or an epoxy (o,m,p)-cresol novolac resin. The alkali-soluble base polymer can be epoxy-substituted polyhydroxystyrene.

The alkali-soluble base polymer preferably comprises a glycidyl (meth)acrylate repeating unit or a (meth)acrylate repeating unit with an alicyclic epoxy group. It is preferable that the alicyclic epoxy group be 3,4-epoxy-1-cyclohexylmethyl radical, 5,6-epoxy-2-bicyclo[2.2.1]heptyl radical, 5(6)-epoxyethyl-2-bicyclo-[2.2.1]heptyl radical, 5,6-epoxy-2-bicyclo-[2.2.1]heptylmethyl radical, 3,4-epoxytricyclo-[5.2.1.0$^{2,6}$]decyl radical, 3,4-epoxytricyclo-[5.2.1.0$^{2,6}$]decyloxyethyl radical, 3,4-epoxytetracyclo-[4.4.0.1$^{2,5}$.1$^{7,10}$] dodecyl radical, or 3,4-epoxytetracyclo-[4.4.0.1$^{2,5}$.1$^{7,10}$] dodecylmethyl radical.

In a negative resist composition according to the invention, it is preferable that the silicon-containing crosslinker is a dihydroxy-terminated poly (dimethylsiloxane) oligomer or polymer. The amount of the silicon-containing crosslinker is preferably in a range of about 5.0–50% by weight based on the total weight of the alkali-soluble base polymer.

The amount of the PAG is preferably in a range of about 1.0–10% by weight based on the total weight of the alkali-soluble base polymer. The PAG is preferably a triarylsulfonium salt, a diaryliodonium salt, or a mixture of the foregoing salts, and more preferably, triphenylsulfonium triflate, diphenyliodonium triflate, di-t-butylphenyliodium triflate, or a mixture of the foregoing materials.

A negative resist composition according to another embodiment of the present invention further comprises an organic base. The amount of the organic base is preferably in a range of about 0.01–2.0% by weight based on the content of the PAG. Preferably, the organic base comprises triethylamine, triisobutylamine, trioctylamine, triisodecylamine, triethanolamine, and a mixture of the foregoing materials.

In another embodiment of the present invention, a patterning method for a semiconductor device is provided in which fine patterns are formed according to a BLR process using a negative resist composition according to the present invention. In the method, initially, a first resist layer is formed on a target layer to be etched on a semiconductor substrate. Next, a second resist layer is formed on the first resist layer by coating with a negative resist composition according to the invention. The second resist layer is subjected to pre-baking and exposure processes. The exposed second resist layer is baked (post-exposure baking) and developed into a second resist layer pattern. The first resist layer is etched using the second resist layer pattern as an etching mask to form a first resist layer pattern. Then, the target layer is etched using the first resist layer pattern as an etching mask. Preferably, in the exposure process, a KrF, ArF, or $F_2$ eximer laser is used.

A negative resist composition according to an embodiment of the present invention, which comprises a base polymer having an epoxy ring substituent and a crosslinker having hydroxy groups, provides good adhesion and wettability to an underlying layer. A negative resist composition according to the present invention is highly transparent in a short-wavelength region, such as the region of light emitted by a KrF, ArF, or $F_2$ eximer laser, and exhibits high resolution and high aspect ratio. Therefore, a negative resist composition according to the present invention can be effectively used in BLR processes and in forming fine patterns having a high aspect ratio required for highly integrated semiconductor devices.

BRIEF DESCRIPTION OF THE DRAWINGS

The present invention will become more apparent by describing in detail preferred embodiments thereof with reference to the attached drawings in which.

DETAILED DESCRIPTION OF PREFERRED EMBODIMENTS

Figure 1:
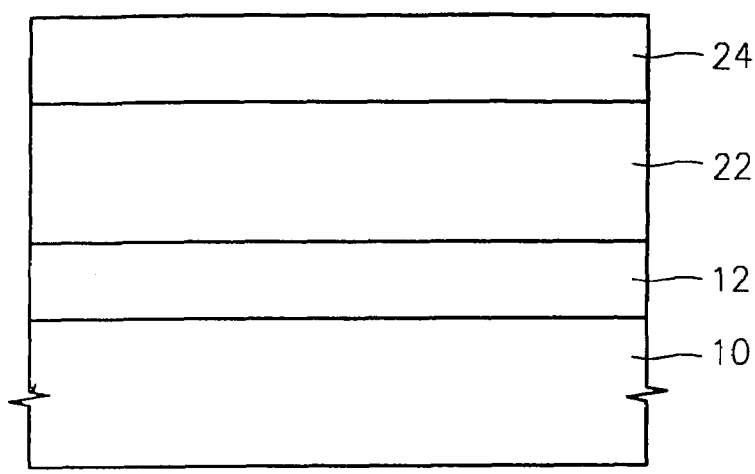
FIGS. 1 through 4 are sectional views for illustrating step by step a method for forming patterns for a semiconductor device according to an embodiment of the present invention.

According to an embodiment of the present invention, a negative resist composition generally comprises an alkali-soluble base polymer having an epoxy ring substitutent, a silicon-containing crosslinker having multiple hydroxy functional groups, and a photoacid generator (PAG). The alkali-soluble base polymer preferably includes a novolac resin, polyhydroxystyrene, or a (meth)acrylate polymer, all of which have an epoxy ring. The novolac resin with an epoxy ring may include, e.g., epoxy phenol-novolac resins and epoxy (o, m, p)-cresol novolac resins. Further, a polyhydroxystyrene with an epoxy ring may include, e.g., epoxy-substituted poly-o-hydroxystyrene, epoxy-substituted poly-m-hydroxystyrene, epoxy-substituted poly-p-hydroxystyrene, and a copolymer of any of the foregoing materials.

The (meth)acrylate polymer with an epoxy ring has a glycidyl (meth)acrylate repeating unit, which includes a glycidyl group as the epoxy group, or a (meth)acrylate repeating unit with an alicyclic epoxy group. Examples of the alicyclic epoxy group includes 3,4-epoxy-1-cyclohexylmethyl radical, 5,6-epoxy-2-bicyclo[2.2.1]heptyl radical, 5(6)-epoxyethyl-2-bicyclo-[2.2.1]heptyl radical, 5,6-epoxy-2-bicyclo-[2.2.1]heptylmethyl radical, 3,4-epoxytricyclo-[5.2.1.0$^{2,6}$]decyl radical, 3,4-epoxytricyclo-[5.2.1.0$^{2,6}$]decyloxyethyl radical, 3,4-epoxytetracyclo-[4.4.0.1$^{2,5}$.1$^{7,10}$] dodecyl radical, and 3,4-epoxytetracyclo-[4.4.0.1$^{2,5}$.1$^{7,10}$] dodecylmethyl radical. The (meth)acrylate repeating unit with the alicyclic epoxy group is used in such an amount that the alkali-soluble base polymer can be well developed using an alkali solution.

In a negative resist composition according to the present invention, a silicon-containing crosslinker preferably includes a dihydroxy-terminated poly(dimethylsiloxane) oligomer or polymer. The silicon-containing crosslinker is preferably used in an amount of about 5.0–50% by weight based on the total weight of the alkali-soluble base polymer.

In a negative resist composition according to the present invention, a PAG preferably includes a triarylsulfonium salt, a diaryliodonium salt, or a mixture of the foregoing salts. Preferably, the PAG includes triphenylsulfonium triflate, diphenyliodonium triflate, di-t-butylphenyliodium triflate, or a mixture of the foregoing materials. The PAG is preferably used in an amount of about 1.0–10% by weight based on the total weight of the alkali-soluble base polymer.

A negative resist composition according to the present invention may further comprise an organic base. In this case, the amount of the organic base is preferably in the range of about 0.01–2.0% by weight based on the content of the PAG. Preferably, the organic base includes triethylamine, triisobutylamine, trioctylamine, triisodecylamine, triethanolamine, and a mixture of the foregoing materials.

FIGS. 1 through 4 are sectional views for illustrating step by step a method for forming patterns for a semiconductor device according to an embodiment of the present invention.

Referring to FIG. 1, a target layer 12 to be etched is formed on a substrate 10, for example, a semiconductor substrate or a transparent substrate. Next, to form a bi-layer resist (BLR) layer on the target layer 12, a first resist layer 22 is formed on the target layer 12 and then a second resist layer 24 having a thickness of about 100–500 nm is formed by coating the first resist layer 22 with a silicon-containing negative resist composition according to the invention, by spin coating and pre-baking the coated layer. The second resist layer 24 is formed using a negative resist composition according to the present invention as described above. For example, the second resist layer 24 preferably comprises an alkali-soluble base polymer with an epoxy ring substituent, a silicon-containing crosslinker having multiple hydroxy functional groups, and a PAG.

Figure 2:
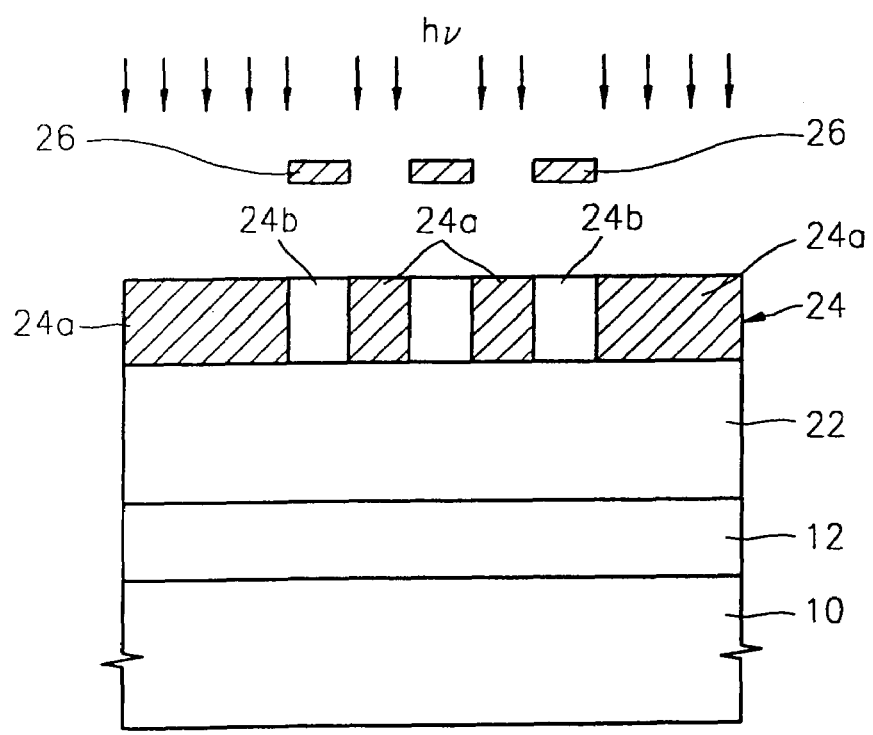

Referring to FIG. 2, a selected region of the second resist layer 24 is exposed through a mask 26 using a KrF, ArF, or $F_2$ eximer laser, so that the second resist layer 24 is divided into an exposed region 24a and a non-exposed region 24b.

Next, the exposed region of the second resist layer 24 is subjected to a post-exposure baking (PEB) process. As a result, a cross-linking reaction takes place due to the acid generated from the PAG in the exposed region 24a of the second resist layer 24.

Figure 3:
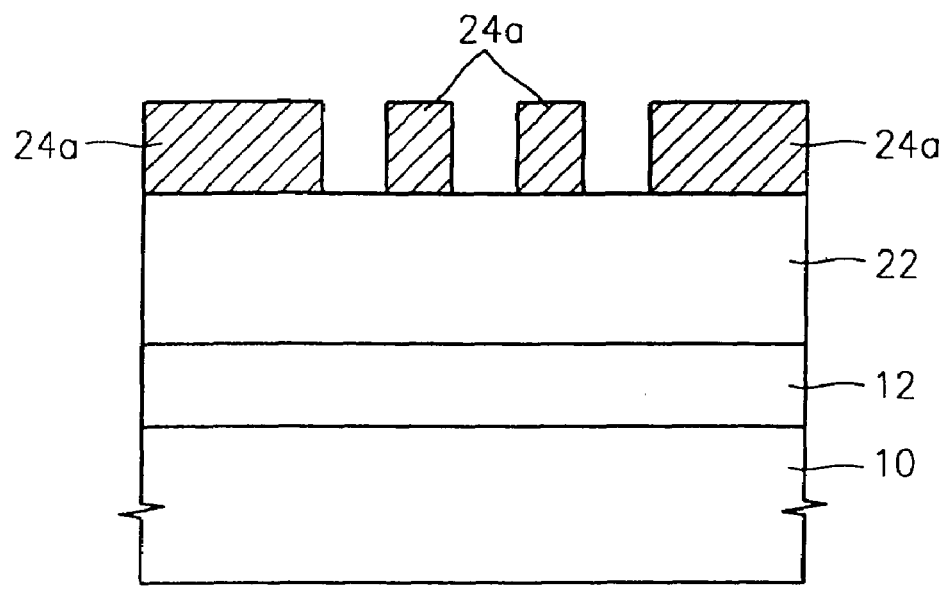

Referring to FIG. 3, the exposed second resist layer 24 is developed using an alkaline developer solution, such as a tetramethylammonium hydroxide (TMAH) solution, to remove the non-exposed region 24b and form a second resist layer pattern 24a, which is a negative pattern of the exposed regions 24a.

Figure 4:
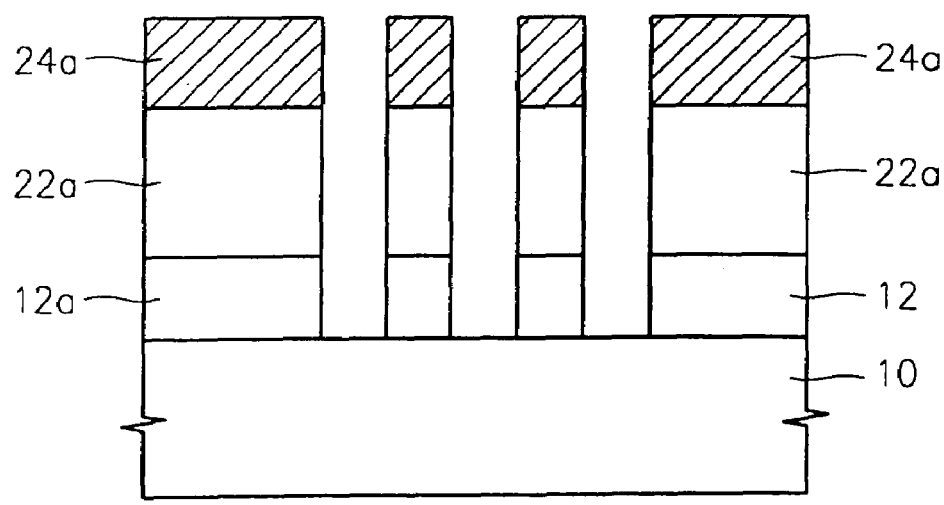

Referring to FIG. 4, the first resist layer 22 is etched using the second resist layer pattern 24a as an etching mask to form a first resist layer pattern 22a. Subsequently, the target layer 12 is etched to form a desired pattern 12a using the first resist layer pattern 22a as an etching mask.

The present invention will be described in greater detail with reference to the following examples. Various changes can be made in the following examples and thus the scope of the invention is not limited to the following examples.

SYNTHESIS EXAMPLE 1

Synthesis of a Base Polymer Having a Glycidyl Methacrylate Repeating Unit

In a round bottom flask, glycidyl methacrylate of 8.5 g (60 mmol) and 2-hydroxyethyl methacrylate of 5.2 g (40 mmol) are placed and dissolved in tetrahydrofuran (THF) of 40 g with an addition of azobisisobutyronitrile (AIBN) of 0.82 g (5 mol %). After purging with nitrogen gas, the mixture is subjected to a polymerisation process at a temperature of about 65° C. for 20 hours.

After the polymerisation process is completed, a reaction product is slowly precipitated in an excess of an n-hexane solution, and a precipitate is filtered. The precipitate is dissolved again in an appropriate amount of THF and reprecipitated in the n-hexane solution. A resulting precipitate is dried in a vacuum oven at 50° C. for 24 hours to obtain a desired polymer with a yield of 80%.

The resulting polymer has a weight average molecular weight (Mw) of 17,500 and a polydispersity (Mw/Mn) of 2.2.

SYNTHESIS EXAMPLE 2

Synthesis of a Base Polymer Having a Glycidyl Methacrylate Repeating Unit 70 mmol of glycinyl methacrylate and 30 mmol of 2-hydroxyethyl acrylate are polymerized to obtain a desired polymer with a yield of 75% by synthesis in the same manner as in synthesis example 1.

The resulting polymer has a weight average molecular weight (Mw) of 15,300 and a polydispersity (Mw/Mn) of 2.1.

SYNTHESIS EXAMPLE 3

Synthesis of Epoxy-substituted Polyhydroxystyrene Base Polymer 12 g (0.1 mol) of polyhydroxystyrene (Mw=12,000, Mw/Mn=1.1) and 50 mmol of epichlorohydrin are dissolved in an appropriate amount of THF in the presence of 0.1 mol of triethylamine and reacted at reflux for about 12 hours.

After a reaction is completed, a reaction product is slowly precipitated in excess n-hexane solution, and a precipitate is filtered. The precipitate is dissolved again in an appropriate amount of THF and reprecipitated in n-hexane solution. The resulting precipitate is dried in a vacuum oven at 50° C. for 24 hours to obtain a desired polymer with an yield of 80%.

SYNTHESIS EXAMPLE 4

Synthesis of an Epoxy Novolac Resin Base Polymer

An i-line novolac resin is reacted with epichlorohydrin to form a desired polymer by synthesis in the same manner as in synthesis example 3.

EXAMPLE 1

Preparation of a Resist Composition and Its Lithography Performance

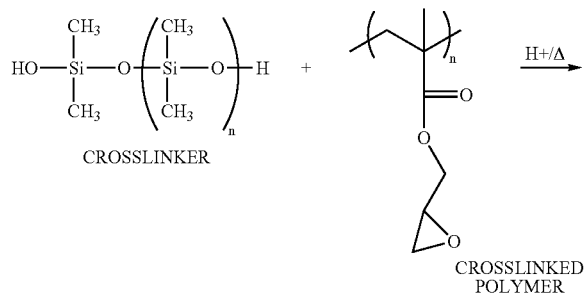

1 g of polymer synthesized in synthesis example 1, 0.2 g of crosslinker hydroxy-terminated poly(dimethylsiloxane) (Mn=500, Aldrich Chemical Co.), and 0.02 g of photoacid generator triphenylsulfonium triflate are dissolved in 8 g propylene glycol methyl ether acetate (PGMEA), followed by an addition of 1 mg of organic base triisobutylamine to completely dissolve the materials. A resulting resist solution is filtered using a 0.2 μm-membrane filter.

The filtered resist solution is coated on a bare silicon wafer, which is treated with hexamethyldisilazne (HMDS), to a thickness of about 0.30 μm, followed by soft backing at 120° C. for 90 seconds, and subjected to exposure using an ArF eximer laser stepper (NA=0.6 and σ=0.75).

Next, the wafer with the resist layer is subjected to post-exposure baking (PEB) at 120° C. for 60 seconds and development in a tetramethylammonium hydroxide (TMAH) solution of about 2.38% by weight for 60 seconds. As a result, a sharp line and space pattern having a width of 180 nm can be obtained with an exposure dose of 15 mJ/cm$^2$.

EXAMPLE 2

Preparation of a Resist Composition and its Lithography Performance

Different photoresist compositions are prepared using 1 g of each of the polymers synthesized in synthesis examples 2 through 4 in the same manner as in example 1, and a lithography performance is evaluated. For all of the photoresist compositions, a sharp line and space pattern having a width of 180 nm can be obtained with an exposure dose of 15 mJ/cm$^2$.

EXAMPLE 3

Preparation of a Resist Composition and Its Lithography Performance 1 g of polymer synthesized in synthesis example 3, 0.2 g of crosslinker dihydroxy-terminated poly(dimethylsiloxane-co-diphenylsiloxane) (viscosity=60 cSt, Aldrich Chemical Co.), and 0.02 g of photoacid generator triphenylsulfonium triflate are dissolved in 8 g of PGMEA, followed by an addition of organic base triisobutylamine of 1 mg to completely dissolve the materials. The resulting resist solution is filtered using a 0.2 μm-membrane filter.

A filtered resist solution is coated on a HMDS-treated bare silicon wafer to a thickness of about 0.30 μm, followed by soft backing at 120° C. for 90 seconds and exposure using an ArF eximer laser stepper (NA=0.6 and σ=0.75).

Next, the wafer with the resist layer is subjected to PEB at 120° C. for 60 seconds and development in a TMAH solution of about 2.38% by weight for 60 seconds. As a result, a sharp line and space pattern having a width of 180 nm can be obtained with an exposure dose of 13 mJ/cm$^2$.

As described above, a negative resist composition according to one preferred embodiment of the present invention includes an alkali-soluble base polymer having an epoxy ring substituent, a silicon-containing crosslinker having multiple hydroxy groups, and a PAG. Unlike conventional resist compositions for use in BLR processes, which typically contain silicon atoms substituted into the polymer backbone, in a negative resist composition according to the present invention, silicon atoms are incorporated into the crosslinker. Accordingly, the amount of silicon in the resist composition can be more easily controlled, and a negative resist composition according to the present invention will have high dry-etching resistance due to the silicon. Preferably, a negative resist composition according to the present invention comprises a base polymer having an epoxy ring and a hydroxy-terminated crosslinker, so that its adhesion and wettability to the underlying layer can be easily controlled. Preferably, the negative resist composition is highly transparent in a short-wavelength region such as a region of light emitted by a KrF, ArF, or $F_2$ eximer laser, and exhibits a high resolution and a high aspect ratio. Therefore, the negative resist composition according to the present invention can be effectively used in BLR processes and in forming fine patterns having a high aspect ratio required for highly integrated semiconductor devices.

While the present invention has been particularly shown and described with reference to preferred embodiments thereof, it will be understood by those of ordinary skill in the art that various changes in form and details may be made therein without departing from the spirit and scope of the present invention as claimed by the following claims.

What is claimed is:

1. A method for forming patterns for a semiconductor device, comprising:
   forming a first resist layer on a target layer to be etched on a semiconductor substrate;
   forming a second resist layer by coating the first resist layer with a negative resist composition, wherein the negative resist composition comprises an alkali-soluble base polymer having an epoxy ring substituent, said alkali-soluble base polymer having an epoxy ring substituent comprising one of an epoxy novolac resin, an epoxy-substituted polyhydroxystyrene, a glycidyl (meth)acrylate repeating unit or a (meth)acrylate repeating unit with an alicyclic epoxy group, a silicon-containing crosslinker having multiple hydroxy groups, and a photoacid generator;
   pre-baking the second resist layer;
   exposing the second resist layer;
   performing post-exposure baking on the exposed second resist layer;
   developing the exposed second resist layer to form a second resist layer pattern;
   etching the first resist layer using the second resist layer pattern as an etching mask to form a first resist layer pattern; and
   etching the target layer using the first resist layer pattern as an etching mask.

2. The method of claim 1, wherein a KrF, ArF, or $F_2$ eximer laser is used to expose, the second resist layer.

3. The method of claim 1, wherein the alkali-soluble base polymer of the negative resist composition is an epoxy phenol-novolac resin or an epoxy (o,m,p)-cresol novolac resin.

4. The method of claim 1, wherein the alkali-soluble base polymer of the negative resist composition is epoxy-substituted polyhydroxystyrene.

5. The method of claim 1, wherein the alkali-soluble base polymer of the negative resist composition comprises a glycidyl (meth)acrylate repeating unit or a (meth)acrylate repeating unit with an alicyclic epoxy group.

6. The method of claim 1, wherein the alicyclic epoxy group is selected from the group consisting of 3,4-epoxy-1-cyclohexylmethyl radical, 5,6-epoxy-2-bicyclo[2.2.1]heptyl radical, 5(6)-epoxyethyl-2-bicyclo-[2.2.1]heptyl radical, 5,6-epoxy-2-bicyclo-[2.2.1]heptylmethyl radical, 3,4-epoxytricyclo-[5.2.1.0$^{2,6}$]decyl radical, 3,4-epoxytricyclo-[5.2.1.0$^{2,6}$]decyloxyethyl radical, 3,4-epoxytetracyclo-[4.4.0.1$^{2,5}$.1$^{7,10}$]dodecyl radical, and 3,4 epoxytetracyclo-[4.4.0.1$^{2,5}$.1$^{7,10}$]dodecylmethyl radical.

7. The method of claim 1, wherein the silicon-containing crosslinker of the negative resist composition is a dihydroxy-terminated poly (dimethylsiloxane) oligomer or polymer.

8. The method of claim 1, wherein the amount of the silicon-containing crosslinker in the negative resist composition is in the range of about 5.0–50% by weight based on the total weight of the alkali-soluble base polymer.

9. The method of claim 1, wherein the amount of the photoacid generator in the negative resist composition is in the range of about 1.0–10% by weight based on the total weight of the alkali-soluble base polymer.

10. The method of claim 1, wherein the photoacid generator of the negative resist composition is a triarylsulfonium salt, a diaryliodonium salt, or a mixture of the foregoing salts.

11. The method of claim 10, wherein the photoacid generator is triphenylsulfonium triflate, diphenyliodonium triflate, di-t-butylphenyliodium triflate, or a mixture of the foregoing materials.

12. The method of claim 1, wherein the negative resist composition further comprises an organic base.

13. The method of claim 12, wherein the amount of the organic base is in a range of about 0.01–2.0% by weight based on the content of the photoacid generator.

14. The method of claim 12, wherein the organic base is selected from the group consisting of triethylamine, triisobutylamine, trioctylamine, triisodecylamine, triethanolamine, and a mixture of the foregoing materials.

15. A method for forming patterns for a semiconductor device, comprising:
   forming a first resist layer on a target layer to be etched on a semiconductor substrate;
   forming a second resist layer by coating the first resist layer with a negative resist composition, wherein the negative resist composition comprises an alkali-soluble base polymer having an epoxy ring substituent, a silicon-containing crosslinker having multiple hydroxy groups, said silicon-containing crosslinker is present in the range of about 5.0–50% by weight based on the total weight of the alkali-soluble base polymer, and a photoacid generator;
   pre-baking the second resist layer;
   exposing the second resist layer;
   performing post-exposure baking on the exposed second resist layer;
   developing the exposed second resist layer to form a second resist layer pattern;
   etching the first resist layer using the second resist layer pattern as an etching mask to form a first resist layer pattern; and
   etching the target layer using the first resist layer pattern as an etching mask.

* * * * *